United States Patent
Witte et al.

(10) Patent No.: US 7,654,147 B2
(45) Date of Patent: Feb. 2, 2010

(54) SENSOR ARRANGEMENT FOR A MOTOR-VEHICLE LOCKING DEVICE AND AN ASSOCIATED METHOD

(75) Inventors: Martin Witte, Ahaus (DE); Helmut Schumacher, Coesfeld (DE)

(73) Assignee: Huf Hulsbeck & Furst GmbH & C. KG, Velbert (DE)

( * ) Notice: Subject to any disclaimer, the term of this patent is extended or adjusted under 35 U.S.C. 154(b) by 193 days.

(21) Appl. No.: 11/988,837

(22) PCT Filed: Jul. 21, 2006

(86) PCT No.: PCT/EP2006/064535

§ 371 (c)(1),
(2), (4) Date: Jan. 15, 2008

(87) PCT Pub. No.: WO2007/012613

PCT Pub. Date: Feb. 1, 2007

(65) Prior Publication Data

US 2009/0133510 A1    May 28, 2009

(30) Foreign Application Priority Data

Jul. 26, 2005  (DE) .................... 10 2005 035 479
Nov. 18, 2005 (DE) .................... 10 2005 055 515

(51) Int. Cl.
*G01B 7/16* (2006.01)
(52) U.S. Cl. .......................................... 73/781; 73/760
(58) Field of Classification Search ............ 73/760–860
See application file for complete search history.

(56) References Cited

U.S. PATENT DOCUMENTS

| | | | | |
|---|---|---|---|---|
| 5,543,591 A * | 8/1996 | Gillespie et al. | ......... | 178/18.03 |
| 5,639,969 A * | 6/1997 | D'Adamo | ..................... | 73/818 |
| 6,075,294 A * | 6/2000 | Van den Boom et al. | ... | 307/10.1 |
| 6,794,728 B1* | 9/2004 | Kithil | .......................... | 257/532 |
| 7,334,776 B2* | 2/2008 | Kazerooni | .................. | 254/270 |

FOREIGN PATENT DOCUMENTS

| | | |
|---|---|---|
| DE | 10159336 A1 * | 12/2002 |
| DE | 10204025 A1 * | 8/2003 |
| EP | 1339025 A1 * | 8/2003 |

* cited by examiner

*Primary Examiner*—Max Noori
(74) *Attorney, Agent, or Firm*—Fay Sharpe LLP

(57) ABSTRACT

A method for detecting the application of an operator's body part to an operating point of a locking device for a motor vehicle is performed by first detecting the proximity of the operator's body part to the operating point via a proximity sensor. A change in the pressure exerted on the operating point by the operator's body part is detected using a mechanical sensor which is arranged on the operating point. An output signal, which indicates the application of the operator's body part, is generated by an evaluation circuit as a function of the sensor output signals from the proximity sensor and the mechanical sensor. When the evaluation circuit detects the beginning of the application of the operator's body part on the basis of the sensor output signal from the mechanical sensor, a sensor output signal value which is output at approximately the same time by the proximity sensor is detected. This is used to evaluate the subsequent changes in the sensor output signal in order to be able to detect in a more reliable manner that the operator's body part has been withdrawn from the operating point. Also disclosed is an associated sensor arrangement.

13 Claims, 4 Drawing Sheets

SENSOR ARRANGEMENT FOR A MOTOR-VEHICLE LOCKING DEVICE AND AN ASSOCIATED METHOD

The invention relates to a sensor arrangement for detecting the application of an operator's body part to an actuating point of a locking device of a motor vehicle, with a proximity sensor which is disposed in such a way that the proximity sensor can detect the proximity of the operator's body part to the actuating point, with a mechanical sensor which is disposed on the actuating point and can detect a change in the pressing force exerted on the actuating point by the operator's body part, and with an evaluation circuit which as a function of the sensor output signals from the proximity sensor and the mechanical sensor can generate an output signal which indicates the application of the operator's body part. The invention also relates to a method of detecting the application of an operator's body part to an actuating point of a locking device of a motor vehicle, wherein the proximity of the operator's body part to the operating point is detected using a proximity sensor, a change in the pressing force exerted on the actuating point by the operator's body part is detected using a mechanical sensor which is disposed on the actuating point and an output signal which indicates the application of the operator's body part is generated by an evaluation circuit as a function of the sensor output signals of the proximity sensor and the mechanical sensor.

A sensor arrangement or a method of the type referred to in the introduction are known from the Patent Application DE 10 2004 019 571. The device described in this patent application is based on a motor vehicle locking device in which capacitive sensors which respond to the proximity of an operator's body part, in particular a hand, are accommodated in a door handle. The capacitive sensors each comprise an electrode in the form of a metal surface or metal plate, a feed and evaluation circuit coupled to the electrode and—as reference electrode—a coupling to the vehicle earth. A plurality of the most different feed and evaluation circuits for the capacitive sensor are conceivable. For example the capacitance formed by the electrode and the reference earth can be supplied with a direct current voltage or a high-frequency alternating current voltage. The particular capacitance presence (or—in the case of alternating current voltage—impedance) or the change thereof is detected by the evaluation circuit. Changes to the capacitance are produced for example by the proximity of an operator's hand to the electrode. These changes to the capacitance result from the changes to the electrical field which is formed between the electrode and earth. Basically the proximity of an operator's body part to the electrode leads to an increase in the capacitance. This increase in capacitance is ascertained for example with the aid of a comparator by which a voltage or current value within the evaluation circuit which is representative of the capacitance is compared with a threshold value and generates an output signal as a function of the comparison.

If proximity of a hand is determined with the aid of the capacitive sensor then an output signal which indicates this proximity initiates communication between a control device in the motor vehicle and an ID transmitter ("key") which the operator carries with him, and when as a result of this communication between the motor vehicle and the ID transmitter it is established that this ID transmitter confers access entitlement, a locking device on the door of the motor vehicle is actuated in such a way that either (when access is desired) a door handle is released in such a way that pulling on the door handle opens the door, or the locking device is locked so that pulling on the door handle is ineffective. There are usually two capacitive sensors or two electrode arrangements on the door handle. A first capacitive sensor, the electrode of which is preferably disposed on the inner face of the door handle facing the vehicle door, effects release of the locking device after detection of proximity of a hand so that the door can be opened when the door handle is subsequently pulled. A second capacitive sensor, the electrode of which is preferably disposed on the outer face or upper face of the door handle and is preferably actuated by application of the thumb, effects locking of the closing device when actuation thereof is detected, so that pulling on the door handle remains ineffective.

For both capacitive sensors it is desirable to avoid false trips which are caused either by proximity or contact by another object, such as for example a falling leaf, or by other influences, such as for example rain, snow, ice and pollutants.

In the second capacitive sensor which effects the locking it is also desirable that this sensor is not tripped by the mere application of the hand to the door handle but by the targeted contact of a small actuating point on the door handle.

In a known locking device with a capacitive sensor (DE 196 20 059 A1) not only is the amount or the magnitude of the change in capacitance determined but also the rate of change, in order more reliably to ascertain proximity or contact by a hand. In this case the sensor merely responds to a relatively quick change in capacitance, such as is typical for proximity of the operator's hand, but not to slower changes in capacitance which result for example from the effects of weather and pollutants. As a rule such a procedure is sufficient for the first capacitive sensor which effects unlocking of the locking device.

The second capacitive sensor which effects locking is frequently used for control of so-called convenience functions. These include for example closing opens windows, switching on an alarm signal, closing a vehicle roof and/or folding in wing mirrors, and these functions should be initiated simultaneously with the locking of the locking device. However, closing of the windows and closing of the vehicle roof are operations which require a certain time. In this case it is often provided that these functions are only carried out or continued so long as the sensor which initiates the functions are actuated by the operator, i.e. so long as the operator places a finger on the actuating point. However, as soon as the operator removes his finger from the actuating point the actuation of convenience functions for movable components should be interrupted, for example the closing of the windows or the closing of the roof should be stopped.

However, for this is it necessary for not only the start of the actuation of the capacitive sensor but also the end of the actuation (i.e. the withdrawal of the operator's body part) to be reliably detected. This is not always possible with the sensor arrangement which is known from the Patent Application DE 10 2004 019 571. The additional provision, as proposed there, of a mechanical auxiliary sensor in the form of a piezoelectric sensor which detects the pressing force of the operator's body part on the actuating point does indeed allow better detection of the application of the hand after combined evaluation of the sensor output signals of the capacitive sensor and of the piezoelectric sensor. However, the piezoelectric sensor outputs evaluatable signals only when the actuating force changes. This is the case when a finger is applied to the actuating point (dramatic increase in the pressing force). However, if the finger then remains resting on the actuating point the pressure changes unpredictably (for example reduction in the pressing force or fluctuating increase and decrease in the pressing force) so that an evaluation of the signal does not allow reliable detection of the withdrawal of the finger. The application or withdrawal of the operator's body part (finger) can only be detected with the aid of the output signal of the capacitive sensor. This output signal is monitored and as soon as it is established that the capacitance has fallen below a threshold value it is assumed that the operator's body part (finger) has been withdrawn, and then if appropriate the actuation of the convenience functions for the movable components is then interrupted. In this case the threshold value with which the output signal of the capacitive sensor is compared should be selected so that detection of the proximity of the operator's body part is possible independently of changes in the environmental influences (in particular humidity and pollutants). Moreover, it should be noted that the proximity of the operator's body part (for example a finger) is not always accompanied by the same increase in capacitance. For example the increase in capacitance is substantially lower if the operator is wearing gloves (for example in winter). The threshold value is set sufficiently low to take account of this situation.

With such a low and constant threshold value, however, the case can arise where the increase in the capacitance is indeed reliably detected in the event of proximity of the operator's body part (finger), but not the withdrawal of the operator's body part. This erroneous non-recognition of the withdrawal of the operator's body part can occur in particular if for example the operator's finger is damp and possibly dirty, so that after the withdrawal of the finger from the actuating point conductive residues of dirt and water remain there which because of the coupling to the surroundings of the handle (for example connected to earth) result in a substantially higher capacitance than was present before the proximity of the operator's body part. It is possible that in spite of the withdrawal of the operator's body part the capacitance does not fall below the predetermined threshold, so that the withdrawal is not detected.

The object of the invention is to improve the sensor arrangement or the method of the type set out in the introduction so that the reliability of detection of the withdrawal of the operator's body part is increased.

This object is achieved according to the invention by a sensor arrangement with the features of claim 1 or a method with the features of claim 9.

The sensor arrangement of the type set out in the introduction is characterised according to the invention in that when the sensor output signal from the mechanical sensor indicates the start of the application of the operator's body part the evaluation circuit uses a sensor output signal value which is output at approximately the same time by the proximity sensor for evaluation of the subsequent changes in the sensor output signal of the proximity sensor in order to be able to detect more reliably that the operator's body part has been withdrawn from the actuating point. The proximity sensor is preferably a capacitive proximity sensor having at least one electrode which is disposed in such a way that the proximity sensor can detect proximity to the actuating point.

The invention is based upon the knowledge that the evaluation of the changes to the sensor output signal of the proximity sensor should be made dependent upon a sensor output signal value of the sensor which serves as reference value which is detected at a time at which application of the operator's actuating body part can be very reliably assumed. The application of the operator's body part can be assumed with the highest degree of reliability if the mechanical auxiliary sensor detects the start of the application of the operator's body part, because in particular with the initial pressure of the operator's body part (finger) on the actuating point a significant change to the output signal of the mechanical sensor takes place. As soon as the sensor output signal of the mechanical sensor indicates the start of the application, i.e. the pressure of the operator's body part, it can be assumed for example in a capacitive proximity sensor that the proximity sensor has a capacitance which corresponds approximately to the highest capacitance which can be achieved during actuation (of course the capacitance can still be increases slightly if the operator's body part shifts on the actuating point or presses more firmly and over a larger area). At approximately the same time as the detection of the start of the application the sensor output signal value which has just been output by the proximity sensor is detected and is then used for evaluation of the subsequent changes to the sensor output signal of the proximity sensor. Between the detection of the start of the application of the operator's body part and the approximately simultaneous detection of the sensor output signal value of the proximity there may be a slight time lag without prejudicing operation. However, the time lag may not be greater than the smallest duration of actuation of the sensor arrangement to be expected.

The actuating point can be located on a door handle, a tailgate, a glove box, a start-stop unit and/or other operating points in the interior of the motor vehicle.

In a preferred embodiment of the sensor arrangement or of the method for detecting the application of an operator's body part to an actuating point of a motor vehicle locking device the sensor output signal from the mechanical sensor indicates the start of the application of the operator's body part, as it indicates a dramatic increase in the exerted pressing force by a dramatic change in the signal. The application of the operator's body part is regularly characterised by a dramatic increase in the pressing force which is exerted. The mechanical sensor reacts to the dramatic increase in the pressing force with a dramatic change in the signal, for example a brief voltage pulse.

In a preferred embodiment the sensor output signal value output by the proximity sensor is detected and is used for evaluation of the subsequent changes to the sensor output signal of the proximity sensor, as (i) a threshold value is derived from the sensor output signal value output by the proximity sensor, (ii) and then the sensor output signal of the proximity sensor is compared with the threshold value, and (iii) a change to the output signal which indicates the withdrawal of the operator's body part is generated as soon as the sensor output signal of the sensor falls below the threshold value. Alternatively in the event of converse dependencies it is detected when the threshold value is exceeded. The threshold value is for example derived from the sensor output signal value by subtracting the predetermined voltage from the sensor output signal voltage value. The derivation of the threshold value and the subsequent comparison can take place with program control both in the analogue range and also in the digital range—after corresponding conversion of the voltage values into digital values. The preferred embodiment described relates in principle to a sensor arrangement and a method of detecting the application of an operator's body part to an actuating point of motor vehicle locking device with force sensor-supported adjustment of the response threshold of a proximity sensor.

In a preferred variant the threshold value derived from the sensor output signal value of the proximity sensor is maintained for a predetermined time which corresponds approximately to a maximum expected duration of application of the operator's body part, and then slowly falls to an initial value. Alternatively it may be provided that the threshold value can be allowed to drop immediately after it is slowly set to the output value, the time constant for the fall being selected to be substantially higher than the maximum expected duration of application of the operator's body part.

The mechanical sensor is preferably an economical mechanical sensor which responds in particular to changes to the pressing force, for example a piezoelectric sensor or a capacitive force sensor. The sensor comprises not only a deformation member coupled to the outer wall of the door handle but also a mechano-electrical converter coupled to the deformation element or integrated in the deformation element. The mechanical sensor can additionally include a part of the primary electronic system. Therefore a piezoelectric sensor can be constructed in such a way that it operates without quiescent current, which further minimises the power consumption.

Advantageous and/or preferred modifications of the invention are characterised in the subordinate claims.

The invention is explained in greater detail below with reference to a preferred embodiment which is illustrated in the drawings, in which.

Figure 1:
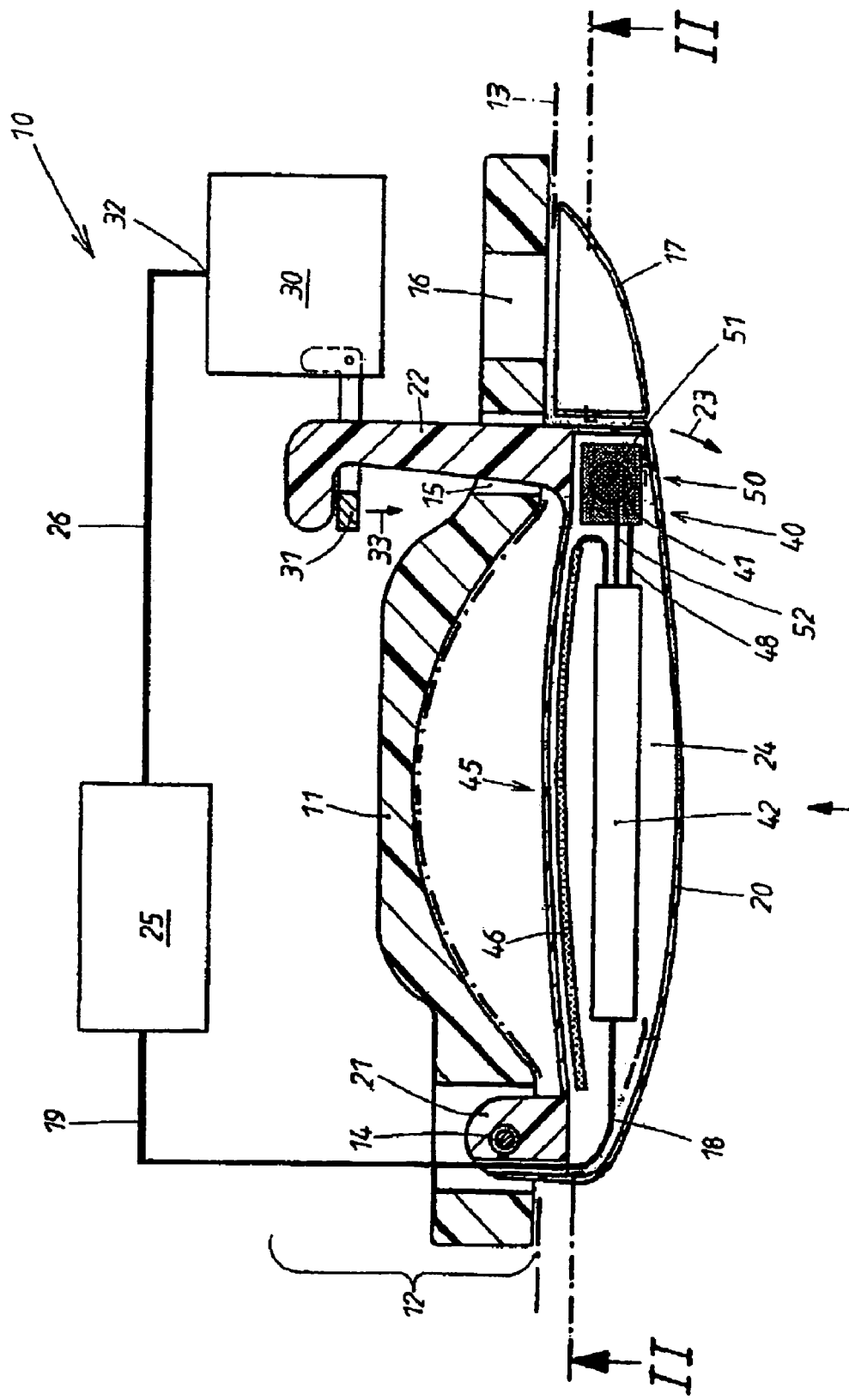
FIG. 1 shows a schematic representation of a horizontal longitudinal section through an outer door handle of a motor vehicle, wherein the outer door handle contains the sensor arrangement according to the invention.
Figure 2:
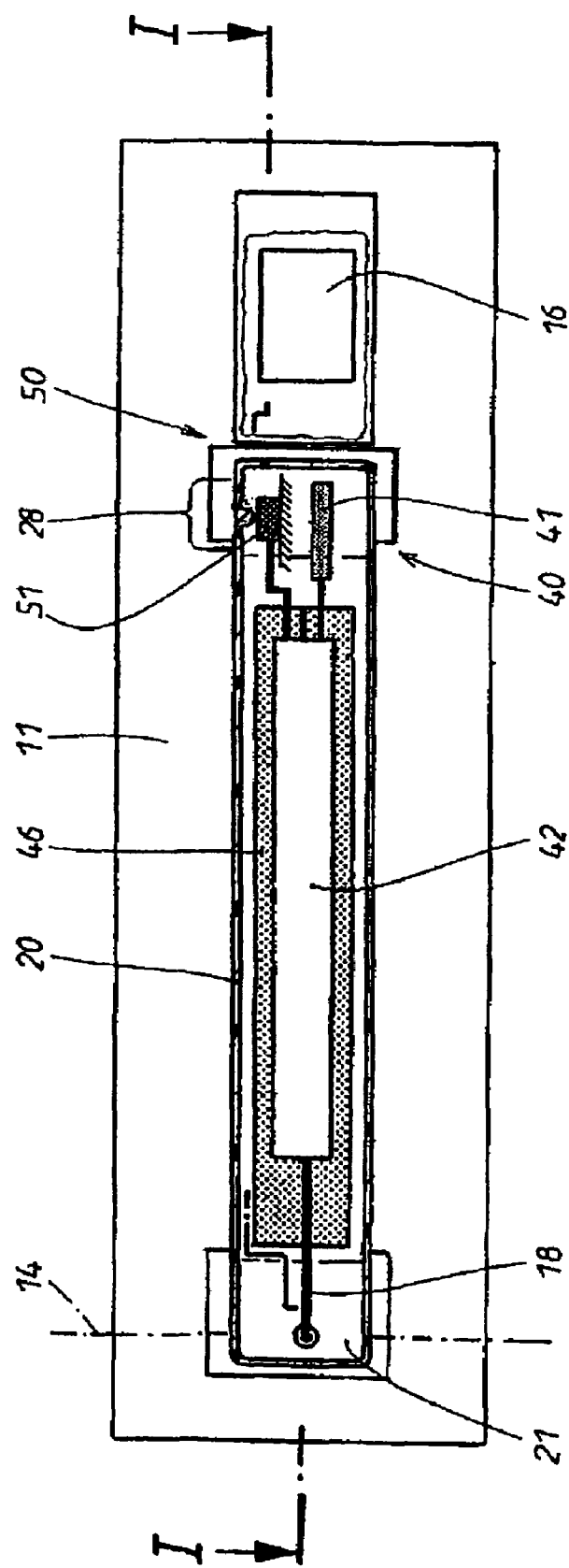
FIG. 2 shows a schematic representation of a vertical longitudinal section through the outer door handle shown in FIG. 1, along the section line II-II.

The locking device 10 of a motor vehicle door handle is shown schematically in FIG. 1 and comprises a support 11 which is mounted in the interior of a door 12 (not shown in detail, only the outer panel 13 thereof being indicated by a dash-dot line) of a motor vehicle, a handle 20 mounted in the support 11, a lock 30 and a control device 25. One end 21 of the door handle 20 is pivotably mounted in the support 11. The illustrated door handle is a so-called "pull handle", in which the pivot mounting has a substantially vertical axis 14. The end 22 of the door handle 20 opposite the pivot bearing has an extension which passes through an opening 15 in the outer door panel 13 and in the support 11 and has a hooked end which engages behind a mechanical receiving element 31 of the lock 30 located in the door. The lock normally holds the door 12 in the closed position. The lock 30 can be located in a locked position and an unlocked position. If the door handle 20 is pivoted in the direction of the arrow 23 then the lock member 31 is entrained by the hooked end in the direction of the arrow 33. If the lock is in the unlocked position then the lock 30 releases the door and the door can be opened. If the lock 30 is in the locked position then this actuation is ineffective; the lock member 31 is entrained in idle motion without the door being released.

In an emergency the lock can be moved from the locked position to the unlocked position by mechanical means, for example by way of a lock cylinder. This is not shown in detail in FIG. 1; this merely shows a further opening 16 in the support 11 and in the outer door panel 13 in which a lock cylinder could be disposed. The lock 30 is normally moved by an electromechanical actuator out of the locked position and into the unlocked position and vice versa. The connections 32 for the actuator on the lock side are connected to a control device via feed lines 26. The control device 25 actuates the actuators o the locks 30 of a motor vehicle as a function of various input signals. Amongst other things, sensors (capacitive proximity sensors 45 and 40 and a mechanical sensor 50) accommodated in the door handle 20 supply control signals via an evaluation circuit likewise accommodated in the door handle 20 and via the lines 18, 19 to the control device. A first capacitive sensor 45 comprises an electrode 46 accommodated on the inner wall of the door handle 20 and an appertaining part of the evaluation circuit 42. A second capacitive sensor comprises an electrode 41 and an appertaining part of the evaluation circuit 42, the electrode 41 being disposed on the upper face of the door handle 20 on the end which is spaced from the pivot mounting 14. The first capacitive sensor 45 which has the electrode 46 serves to initiate an unlocking operation, whilst the second capacitive sensor 40 having the electrode 41 serves to initiate a locking operation of the lock 30. Via the lines 18, 19 the evaluation circuit 42 supplies output signals to the control device 25 which indicate proximity or application of an operator's body part to the electrodes 46 or 41 respectively. Both the electrode 46 and the electrode 41 build up an electrical field around them. The proximity of an operator's hand brings about a change to the electrical field (amongst other things by changing the dielectric constant, but in particular by delivering an earth potential associated with the proximity of the hand due to the coupling of the operator to earth). The increase in capacitance associated with the change of field distribution is detected by the evaluation circuit 42. In this case the first capacitive sensor assigned to the electrode 46 is at a more sensitive setting and already detects the proximity when the hand is still distant from the door handle (for example only inserted in the space behind the door handle). This first capacitive sensor 45 is continuously activated, so that when the proximity of the hand is detected between the control device 25 and a so-called ID transmitter (key) which the operator carries with him a radio dialogue is initiated resulting in checking of the access entitlement of the ID transmitter. If it is ascertained that the ID transmitter located in the vicinity has entitlement to access, then the lock 30 is unlocked, so that pulling on the door handle 20 effects opening of the lock 30. Thus the first capacitive sensor 45 is designated as the "opening sensor". The opening sensor is not the subject of the present invention.

Figure 3:
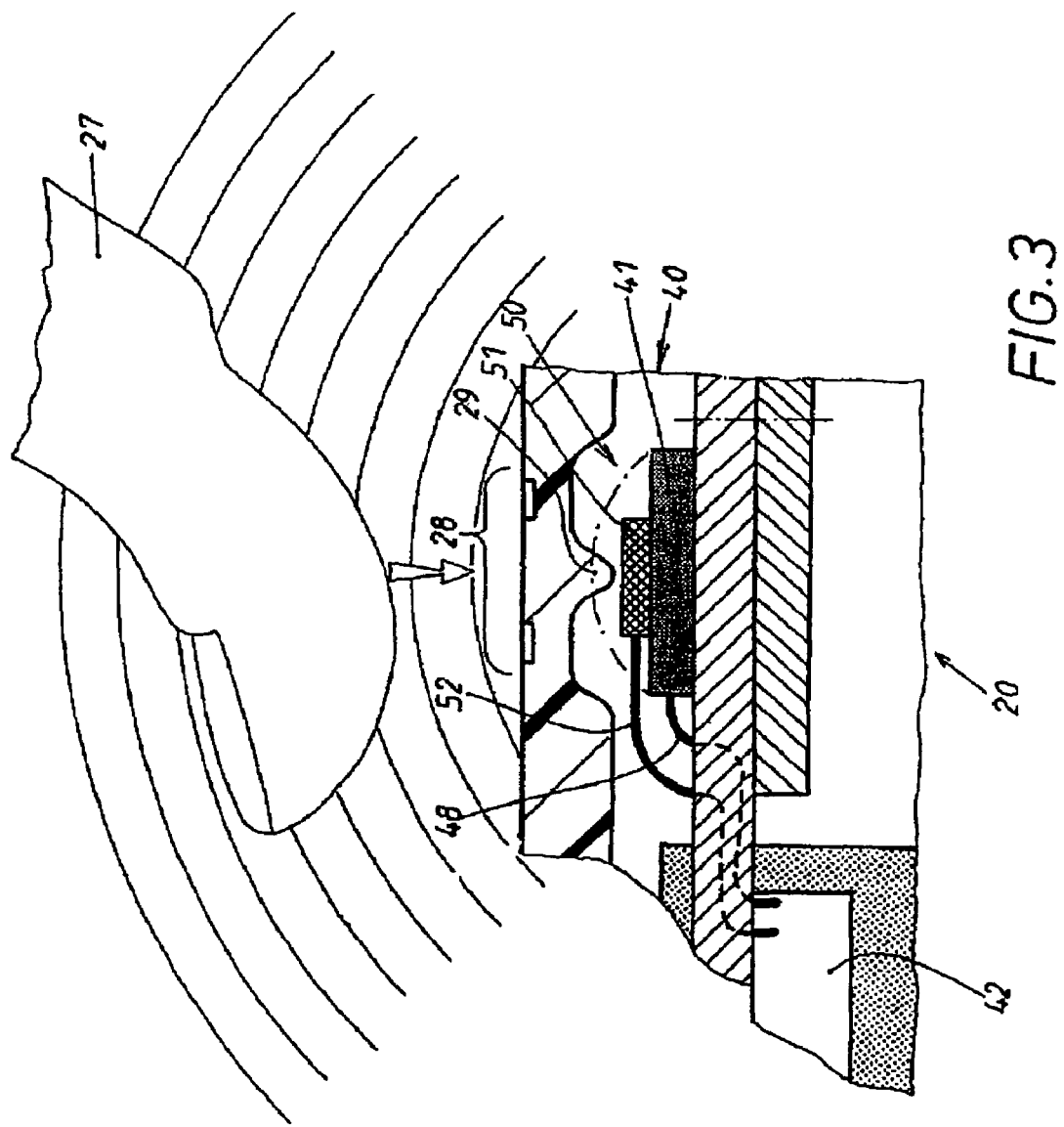
FIG. 3 shows a schematic enlarged representation of the part of the arrangement shown in FIG. 2 which contains the mechanical sensor as well as the electrode of the capacitive proximity sensor.

The second capacitive sensor 40 which only needs to be activated when the door lock 30 is unlocked is less sensitive than the first capacitive sensor and thus only reacts to changes in capacitance which correspond to a very small distance of the operator's body part (application). When application of the operator's body part is detected, this capacitive sensor 40 initiates a locking operation and is therefore designated as the "closing sensor". According to the invention the closing sensor encompasses not only the capacitive sensor 40 but also the additional mechanical auxiliary sensor 50. In the embodiment shown in FIG. 1 the mechanical auxiliary sensor 50 is a piezoelectric sensor which responds to slight mechanical pressure. The output signals of the piezoelectric sensor 50 are also evaluated by the evaluation circuit 42. Both the capacitive main sensor 40 and also the mechanical auxiliary sensor 50 are disposed at the same actuating point 28. This is shown on an enlarged scale in FIG. 3. When a finger 27 approaches the actuating point 28 then—because of the capacitive remote action—the capacitive proximity sensor 40 can respond first of all. When the finger 27 presses on the resilient wall of the door handle at the actuating point 28 a lug 29 on the wall 28 is moved into the interior of the door handle and acts on a piezoelectric element or a deformation member 51 of the mechanical sensor 50 containing the piezoelectric element. The electrical output signals of the piezoelectric element are supplied to the evaluation circuit 42 via the line 52. The electrode 41 of the capacitive proximity sensor, which is also connected to the evaluation circuit 42 via the line 48, is located below the mechanical sensor 50.

Figure 4A:
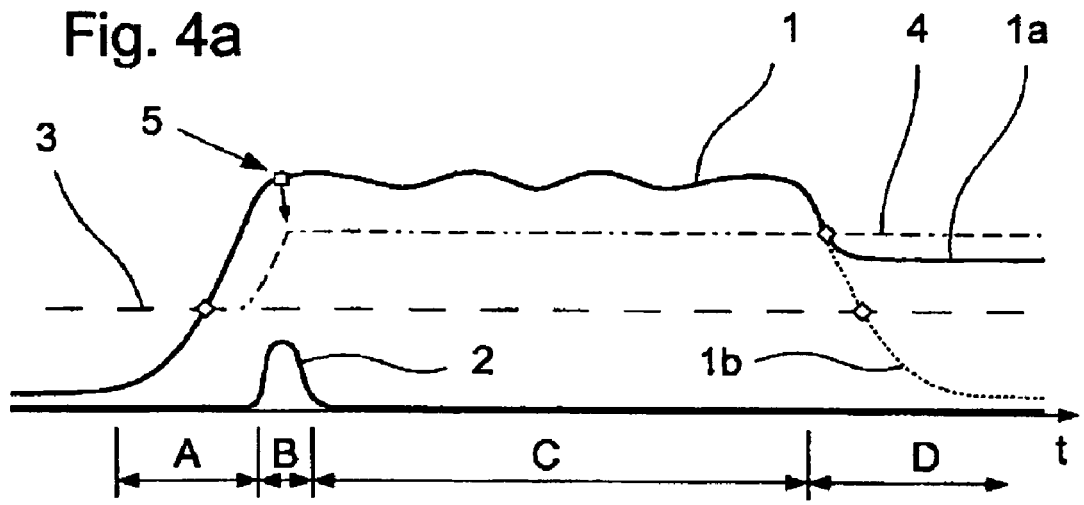
FIGS. 4A to 4C show examples of schematic signal patterns to illustrate the sensor output signals and the output signal which indicates the application of an operator's body part.
Figure 4B:
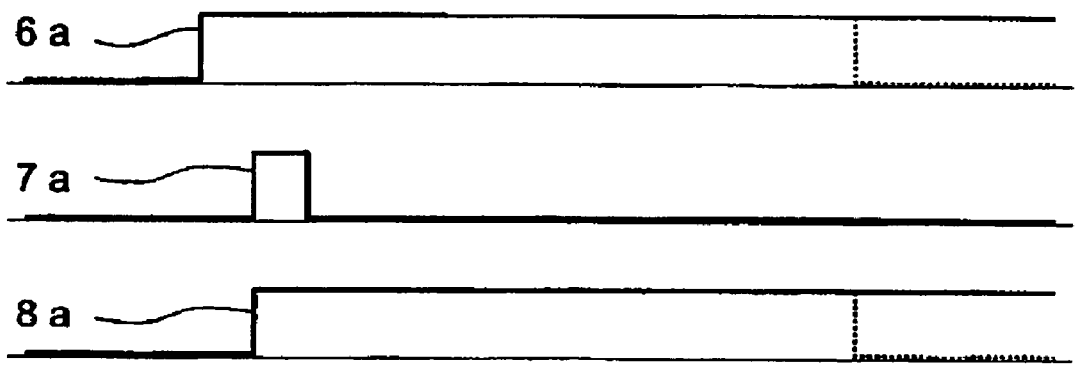
Figure 4C:
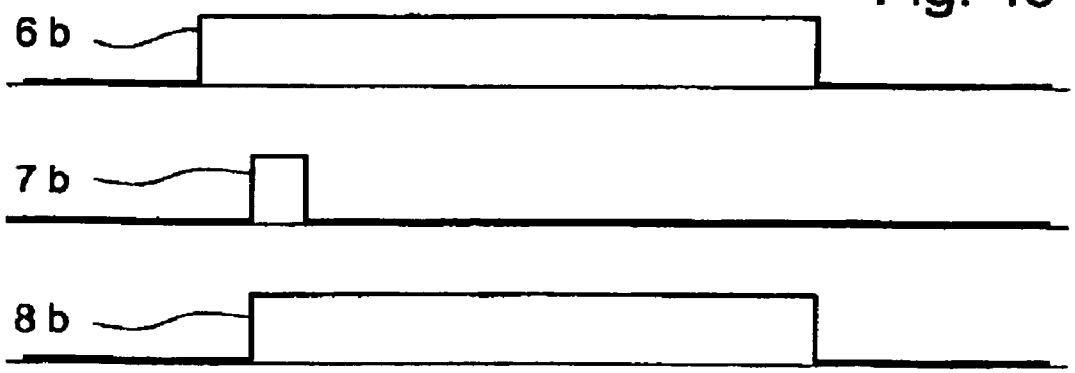

FIGS. 4A to 4C show the evaluation according to the invention of the output signals of the capacitive proximity sensor 40 and of the mechanical sensor 50. FIG. 4A shows the chronological sequences of the sensor output signal 1 of the capacitive proximity sensor and of the sensor output signal 2 of the mechanical auxiliary sensor in the course of actuation of the sensor arrangement.

In the interval A an operator's body part, for example the operator's thumb, approaches the actuating point 28. This results in an increase in the capacitance and thus the sensor output signal 1 of the proximity sensor. The sensor output signal 2 remains unchanged. As soon as the operator's finger is applied to the actuating point 28 in the interval B and exerts a pressing force, the mechanical sensor emits an output pulse. In the interval C the finger remains on the actuating point 28 without the pressing force changing significantly. In the interval D the finger is removed from the actuating point 28. While the finger is applied the sensor output signal 1 of the capacitive sensor remains at a relatively high value and falls when the finger is removed. In order to detect the application of the finger, the output signal 1 of the capacitive sensor is compared with a threshold value 3. In a known arrangement the threshold value 3 is constant (broken line). Thus in the interval A a sensor output signal 1 which exceeds the threshold value 3 is evaluated as proximity of the operator's body part. After removal of the finger in the interval D the sensor output signal 1 falls again, along the line 1b in the normal case, and again falls below the threshold value 3, which enables detection of the removal. However, the case can occur where during removal of the finger the sensor output signal 1 falls less dramatically and results in a pattern along the line 1a shown in FIG. 4A. The sensor output signal (the capacitance) of the capacitive sensor does indeed fall, but is no longer below the threshold value 3. The cause of this may be soiling caused by the actuation associated with moisture. In the conventional arrangement an evaluation of the sensor output signal 1 of the capacitive sensor would not enable removal of the finger to be ascertained. Also inclusion of the additional output signal 2 of the mechanical auxiliary sensor would not enable the removal to be ascertained.

The invention comes into effect here. If in the interval B the pressing of the finger associated with application is detected on the basis of the output signal of the mechanical sensor, then the value 5 of the output signal 1 of the capacitive sensor which is detected at this time is used in order to derive a new threshold value 4 therefrom. The threshold value is raised from the output line 3 in the interval B along the dash-dot line 4. As the operation proceeds further (intervals C and D) the sensor output signal 1 of the capacitive sensor is then compared with the threshold value 4. This also allows reliable detection of the removal of the finger even when the output signal moves along the line 1a due to soiling/moisture. Also this sensor output signal 1A which is higher due to soiling then lies below the (raised) threshold value 4.

FIGS. 4B and 4C show the binary evaluation signals of the capacitive proximity sensor (6a, 6b) derived from the sensor signals and of the mechanical auxiliary sensor (7a, 7b) and the output signal (8a, 8b) indicating the application of the operator's body part both for the arrangement known from the prior art (FIG. 4B) and also for the arrangement according to the invention (FIG. 4C). In the prior art according to FIG. 4B the evaluation signal 6a of the capacitive proximity sensor indicates the application of a finger when the sensor output signal 1 exceeds the threshold value (3). The withdrawal is only detected for the case of the signal pattern 1b shown by broken lines in FIG. 4A. The application of the finger is indicated by the signal 8a when after application of the signal 6a the output signal 7a of the mechanical sensor is additionally briefly present. Then the output signal 8a remains at a high level until the output signal 6a of the capacitive sensor again falls below the threshold value 3, although this can only be detected in the case 1b after withdrawal of the finger.

FIG. 4C shows the corresponding signal patterns in the case of the procedure according to the invention. Here too the signal 8b which indicates the application of the finger is not generated until both the capacitive sensor and also the mechanical sensor have generated a corresponding output signal. then the sensor output signal 1 of the capacitive sensor is compared with the adapted threshold value 4, so that when the finger is withdrawn the output signal 6d also falls to zero again if the signal pattern 1a shown in FIG. 4A is produced. Thus the output signal 8d indicates exactly the withdrawal of the finger.

The invention claimed is:

1. Sensor arrangement for detecting the application of an operator's body part to an actuating point of a locking device of a motor vehicle,
   with a proximity sensor which is disposed in such a way that the proximity sensor can detect the proximity of the operator's body part to the actuating point,
   with a mechanical sensor which is disposed on the actuating point and can detect a change in the pressing force exerted on the actuating point by the operator's body part,
   and with an evaluation circuit which as a function of the sensor output signals from the proximity sensor and the mechanical sensor can generate an output signal which indicates the application of the operator's body part,
   characterised in that
   when the sensor output signal from the mechanical sensor indicates the start of the application of the operator's body part the evaluation circuit uses a sensor output signal value which is output at approximately the same time by the proximity sensor for evaluation of the subsequent changes in the sensor output signal of the proximity sensor in order to be able to detect more reliably that the operator's body part has been withdrawn from the actuating point.

2. Sensor arrangement as claimed in claim 1, characterised in that the proximity sensor is a capacitive proximity sensor having at least one electrode which is disposed in such a way that the capacitive proximity sensor can detect proximity to the actuating point.

3. Sensor arrangement as claimed in claim 2, characterised in that the sensor output signal from the mechanical sensor indicates the start of the application of the operator's body part, as it indicates a dramatic increase in the exerted pressing force by a dramatic change in the signal.

4. Sensor arrangement as claimed in claim 1, characterised in that the evaluation circuit uses the sensor output signal value output by the proximity sensor for evaluation of the subsequent changes to the sensor output signal by deriving a threshold value from the sensor output signal value output simultaneously by the proximity sensor, then it compares the sensor output signal from the capacitive proximity sensor with the threshold value and effects a change to the output signal which indicates the withdrawal of the operator's body part when the sensor output signal from the proximity sensor falls below the threshold value.

5. Sensor arrangement as claimed in claim 4, characterised in that the evaluation circuit maintains the threshold value for a predetermined time which corresponds approximately to a maximum expected duration of application of the operator's body part, and then slowly lowers the threshold value to an initial value.

6. Sensor arrangement as claimed in claim 4, characterised in that the mechanical sensor is a piezoelectric sensor or a capacitive force sensor.

7. Sensor arrangement as claimed in claim 4, characterised in that the actuating point is located on a motor vehicle door handle.

8. Sensor arrangement as claimed in claim 7, characterised in that the mechanical sensor is disposed between the electrode of a capacitive proximity sensor and a resilient outer wall of the motor vehicle door handle.

9. Sensor arrangement as claimed in claim 7, characterised in that the mechanical sensor is disposed below the electrode of a capacitive proximity sensor, wherein the electrode and an outer wall of the motor vehicle door handle lying above it are constructed in such a way that they allow a transfer of a pressing force to the mechanical sensor.

10. Method of detecting the application of an operator's body part to an actuating point of a locking device of a motor vehicle, in which:
    the proximity of an operator's body part to the actuating point is detected by a proximity sensor,
    a change to a pressing force exerted by the operator's body part on the actuating point is detected by a mechanical sensor disposed on the actuating point, and
    an output signal which indicates the application of the operator's body part is generated by an evaluation circuit as a function of the sensor output signals from the proximity sensor and the mechanical sensor,
    characterised in that
    when the start of the application of the operator's body part is detected by the evaluation circuit on the basis of the sensor output signal from the mechanical sensor, a sensor output signal value which is output at approximately the same time by the proximity sensor is detected and is used for evaluation of the subsequent changes in the sensor output signal of the proximity sensor in order to be able to detect more reliably that the operator's body part has been withdrawn from the actuating point.

11. Method as claimed in claim 10, characterised in that the start of the application of the operator's body part is indicated by the sensor output signal from the mechanical sensor as a dramatic increase in the exerted pressing force is indicated by a dramatic change in signal.

12. Method as claimed in claim 10, characterised in that the sensor output signal value output simultaneously by the proximity sensor is detected by the evaluation circuit and is used for evaluation of the subsequent changes to the sensor output signal from the proximity sensor in that:
    a threshold value is derived from the sensor output signal value output simultaneously by the proximity sensor,
    then the sensor output signal from the proximity sensor is compared with the threshold value, and
    a change to the output signal indicating the withdrawal of the operator's body part is generated as soon as the sensor output signal from the proximity sensor falls below the threshold value.

13. Method as claimed in claim 12, characterised in that the threshold value is maintained for a predetermined time which corresponds approximately to a maximum expected duration of the application of the operator's body part and is then lowered slowly to an initial value.

* * * * *